(12) United States Patent
Fukutome

(10) Patent No.: US 9,431,208 B2
(45) Date of Patent: Aug. 30, 2016

(54) CHARGED-PARTICLE BEAM DRAWING APPARATUS AND VIBRATION DAMPING MECHANISM

(71) Applicant: NUFLARE TECHNOLOGY, INC., Yokohama-shi (JP)

(72) Inventor: Shuichiro Fukutome, Yokohama (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 14/830,919

(22) Filed: Aug. 20, 2015

(65) Prior Publication Data

US 2016/0056009 A1    Feb. 25, 2016

(30) Foreign Application Priority Data

Aug. 21, 2014   (JP) ................. 2014-168300

(51) Int. Cl.
| | |
|---|---|
| *H01J 37/20* | (2006.01) |
| *F16F 15/04* | (2006.01) |
| *H01J 37/02* | (2006.01) |
| *H01J 37/18* | (2006.01) |
| *H01J 37/317* | (2006.01) |

(52) U.S. Cl.
CPC .............. *H01J 37/023* (2013.01); *H01J 37/18* (2013.01); *H01J 37/3174* (2013.01)

(58) Field of Classification Search
CPC ................. H01J 37/00; F16F 15/04
See application file for complete search history.

(56) References Cited

U.S. PATENT DOCUMENTS

| | | | | |
|---|---|---|---|---|
| 4,862,697 A | * | 9/1989 | Tugal | F04B 37/08 248/636 |
| 4,908,519 A | * | 3/1990 | Park | B82Y 35/00 250/442.11 |
| 6,510,755 B1 | * | 1/2003 | Higuchi | F16C 29/025 384/12 |
| 2005/0106043 A1 | * | 5/2005 | Casaro | F04D 19/042 417/363 |

FOREIGN PATENT DOCUMENTS

JP    2002-295581    10/2002

* cited by examiner

*Primary Examiner* — Robert Kim
*Assistant Examiner* — Eliza Osenbaugh-Stewar
(74) *Attorney, Agent, or Firm* — Oblon, McClelland, Maier & Neustadt, L.L.P.

(57) ABSTRACT

A charged-particle beam drawing apparatus has an airtight first elastic tube that is provided on an outer surface of the vacuum chamber and communicates with an inner space of the vacuum chamber, a vibrator that is airtight and provided at an end of the first elastic tube at an opposite side to the vacuum chamber, and communicates with an inner space of the first elastic tube, a second elastic tube that is airtight and provided at an end of the vibrator at an opposite side to the first elastic tube and communicates with an inner space of the vibrator, a terminal closer that is provided at an end of the second elastic tube at an opposite side to the vibrator, and closes the end of the second elastic tube, and a gap holder to keep a gap between the outer surface of the vacuum chamber and the terminal member.

20 Claims, 5 Drawing Sheets

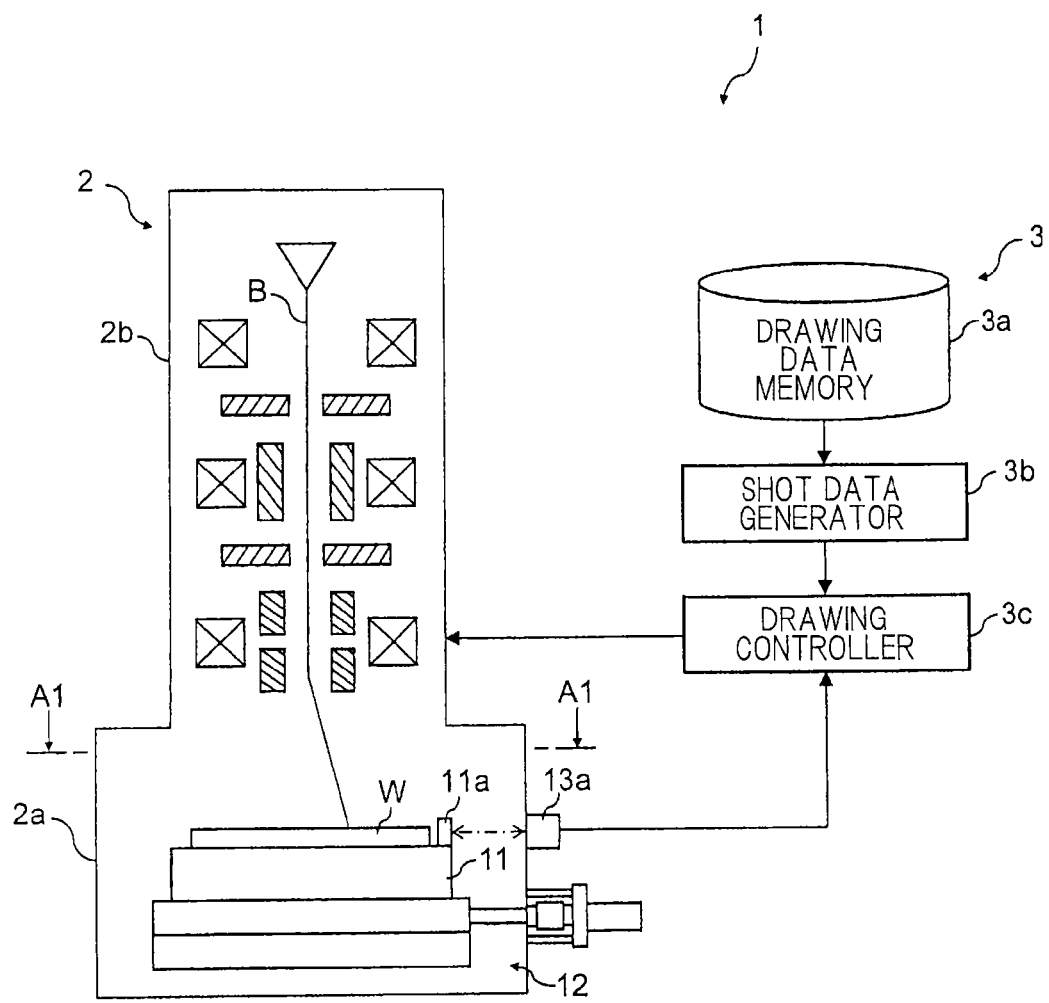
F I G. 1

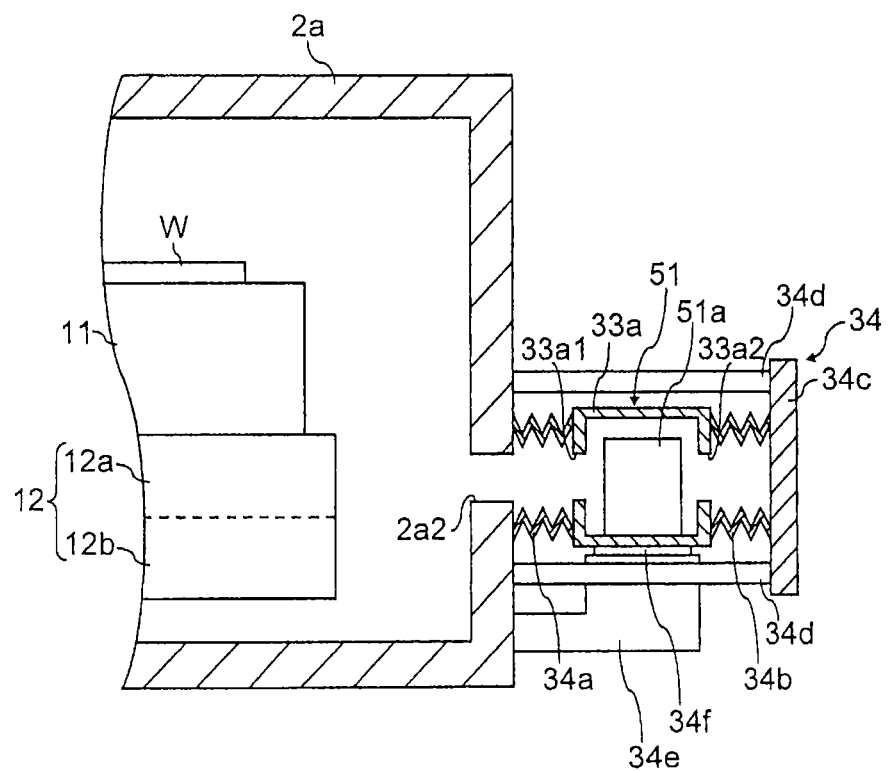
F I G. 5

CHARGED-PARTICLE BEAM DRAWING APPARATUS AND VIBRATION DAMPING MECHANISM

CROSS-REFERENCE TO RELATED APPLICATIONS

This application is based upon and claims the benefit of priority from Japanese Patent Application No. 2014-168300, filed on Aug. 21, 2014; the entire contents of which are incorporated herein by reference.

FIELD

The present invention relates to a charged-particle beam drawing apparatus and a vibration damping mechanism.

BACKGROUND

In general, charged-particle beam drawing apparatuses such as a drawing apparatus, an inspection equipment, an electron microscope, an exposure equipment, using a charged-particle beam (for example, an electron beam) are equipped with a friction-drive moving mechanism for moving a stage, due to an restricted environment of vacuum, magnetic field, etc. The friction-drive moving mechanism moves the stage by friction-driving a rod connected to the stage by a motor attached to the outer surface of a vacuum chamber.

Especially, a charged-particle beam drawing apparatus that requires high resolution is usually equipped with the friction-drive moving mechanism for stage movement. In the charged-particle beam drawing apparatus, the friction-drive moving mechanism moves a stage having a sample such as a mask (reticle) or a blank placed thereon. A charged-particle beam is then defected and emitted onto a specific position of the sample on the stage to draw a pattern on the sample. A laser interferometer is used for detecting the location of the stage. The laser interferometer is attached to the outer surface of a vacuum chamber.

However, in the charged-particle beam drawing apparatus described above, vibration is generated while a motor is driving. The generated vibration is then transferred, via the vacuum chamber, to the laser interferometer located on the outer surface of the vacuum chamber. The laser interferometer measures the stage location. Therefore, if the laser interferometer vibrates due to motor driving, its measurement accuracy reduces, which results in deterioration in apparatus accuracy such as drawing accuracy and inspection accuracy.

BRIEF DESCRIPTION OF THE DRAWINGS

FIG. 1 is a view schematically showing the configuration of a charged-particle beam drawing apparatus according a first embodiment;

FIG. 5 is a sectional view schematically showing the configurations of a pump unit and a vibration damping mechanism according a second embodiment.

DETAILED DESCRIPTION

Figure 2:
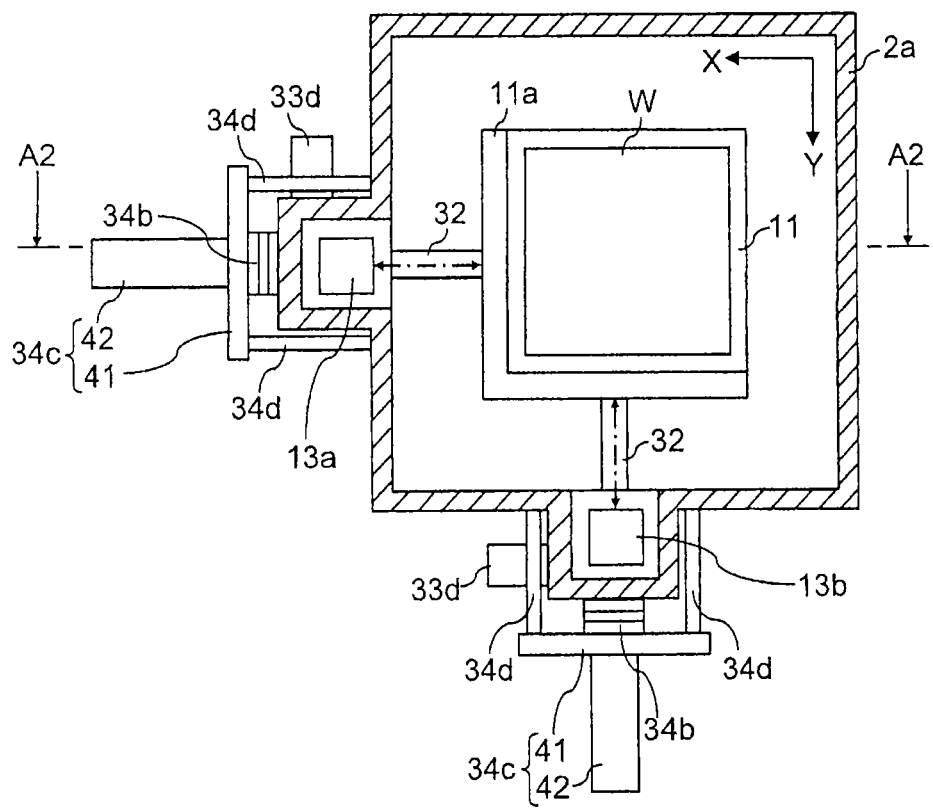
FIG. 2 is a sectional view (taken on line A1-A1 in FIG. 1) schematically showing the configurations of laser interferometers and an XY-stage according the first embodiment.

A charged-particle beam drawing apparatus according to an embodiment is provided with:

an airtight vacuum chamber;

a first elastic tube that is airtight and provided on an outer surface of the vacuum chamber and communicates with an inner space of the vacuum chamber;

an airtight vibrator that is provided at an end of the first elastic tube in the opposite side to the vacuum chamber, and communicates with an inner space of the first elastic tube;

a second elastic tube that is airtight and provided at an end of the vibrator in the opposite side to the first elastic tube and communicates with an inner space of the vibrator;

a terminal closer that is provided at an end of the second elastic tube in the opposite side to the vibrator, and closes the end of the second elastic tube; and a gap holder that is provided between the outer surface of the vacuum chamber and the terminal closer, the gap holder being configured to keep a gap between the outer surface of the vacuum chamber and the terminal closer.

Hereinbelow, embodiments of the present invention will be explained with reference to the drawings.

First Embodiment

A first embodiment will be explained with reference to FIGS. 1 to 4. In the first embodiment, a charged-particle beam drawing apparatus for drawing with a charged-particle beam will be explained as one example of the charged-particle beam drawing apparatus.

As shown in FIG. 1, a charged-particle beam drawing apparatus 1 according to the first embodiment is provided with a drawing unit 2 for drawing with a charged-particle beam and a controller 3 that controls the drawing unit 2. The charged-particle beam drawing apparatus 1 is an example of a variable-shaped beam drawing apparatus using, for example, an electron beam as the charged-particle beam. The charged-particle beam is not limited to the electron beam, which may be an ion beam or the like.

The drawing unit 2 has a drawing chamber (a drawing room) 2a for accommodating a sample W to be subjected to drawing and an optical column 2b connected to the drawing chamber 2a. The drawing chamber 2a is airtight (sealed) to function as a vacuum chamber (decompression chamber). The optical column 2b is disposed on the upper surface of the drawing chamber 2a. The optical column 2b forms and deflects an electron beam B through an optical system, and emits the electron beam B to the sample W in the drawing chamber 2a while the drawing chamber 2a and the optical column 2b are maintained in a vacuum state.

A mount 11 that is a table for supporting the sample W, such as a mask or a blank, and a friction-drive XY-stage 12 for moving the mount 11 are provided inside the drawing chamber 2a. The XY-stage 12 is a mechanism for moving the mount 11 in an X-axis direction and a Y-axis direction (simply referred to as the X-direction and the Y-direction, respectively, hereinafter) perpendicular to each other in the horizontal plane.

The controller 3 is provided with a drawing data memory 3a for storing drawing data, a shot data generator 3b for processing the drawing data to generate shot data, and a drawing controller 3c for controlling the drawing unit 2.

As shown in FIG. 2, a first laser interferometer 13a and a second laser interferometer 13b both for measuring the position of the mount 11 are provided on the outer surface (side surface) of the drawing chamber 2a. The first laser interferometer 13a located at the left side in FIG. 2 measures a relative distance with the mount 11 in the X-direction. The second laser interferometer 13b located at the lower side in FIG. 2 measures a relative distance with the mount 11 in the Y-direction. A reflection unit 11a such as a mirror for reflecting a laser beam is attached to the mount 11.

In drawing with the electron beam B, data on relative distance with the mount 11 measured by the laser interferometers 13a and 13b are used not only for control (feed-back control) on the movement of the mount 11 but also for control (drawing control) of the position irradiated by a deflector or the like in the optical column 2b, both controlled by the drawing controller 3c. Therefore, the measurement accuracy of the laser interferometers 13a and 13b affects the drawing accuracy very much.

Figure 3:
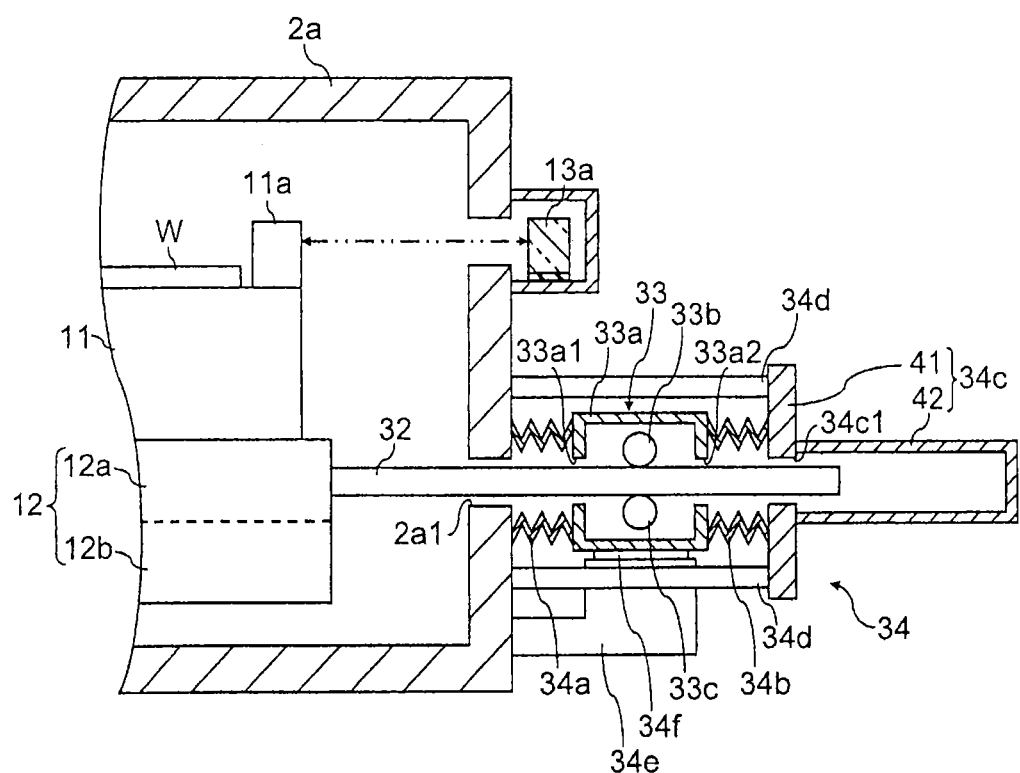
FIG. 3 is a sectional view (taken on line A2-A2 in FIG. 1) schematically showing the configurations of a driver and a vibration damping mechanism according the first embodiment.
Figure 4:
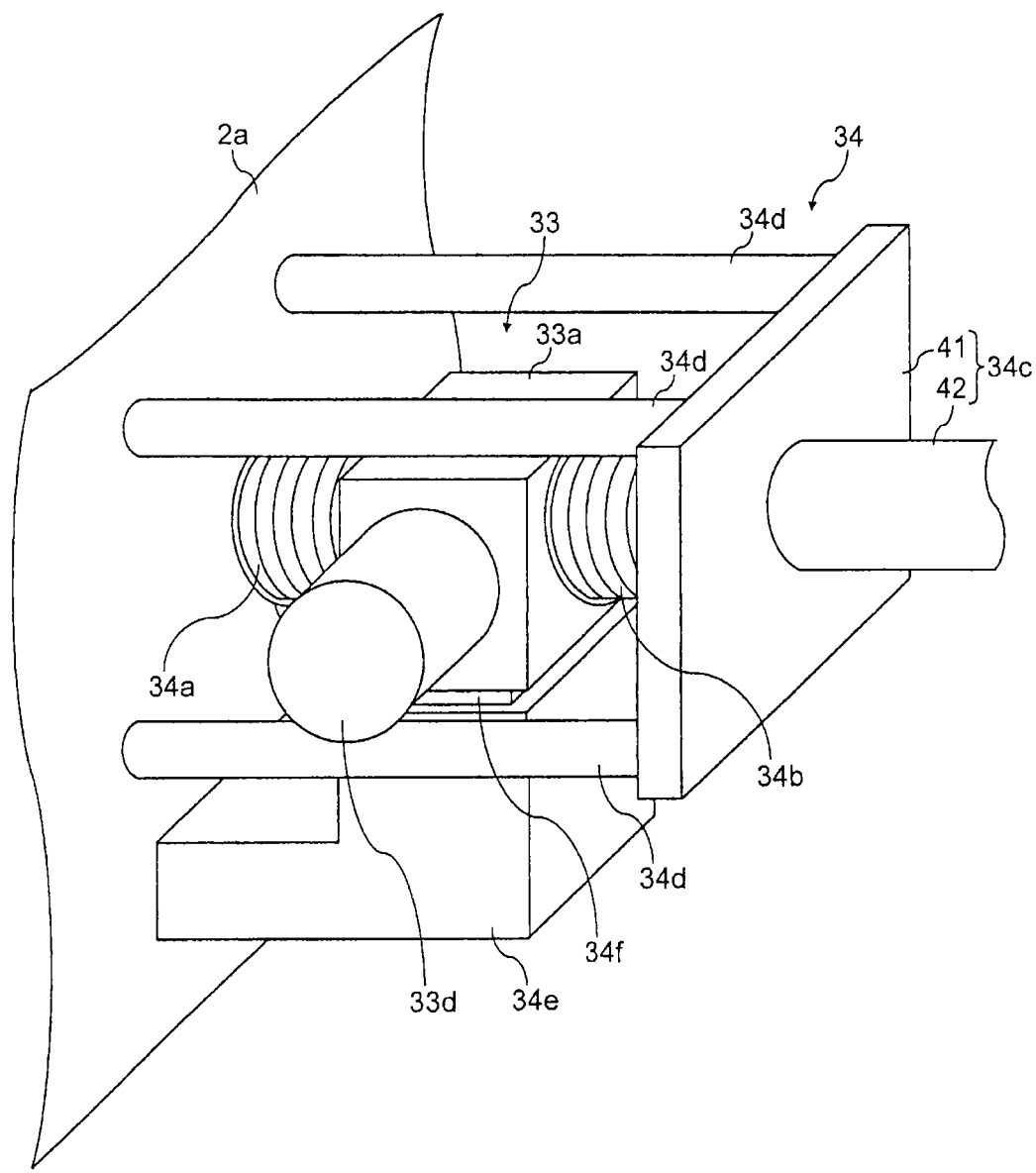
FIG. 4 is an enlarged sectional view of the driver and the vibration damping mechanism according the first embodiment.

As shown in FIGS. 3 and 4, the XY-stage 12 includes an X-stage 12a and a Y-stage 12b. The X-stage 12a supports the mount 11 that is the table for the sample W, coupled to the driver 33 with a rod (a shaft) 32 to move in the X-direction. The driver 33 has a vibration damping mechanism 34 for damping its own vibration. The Y-stage 12b has basically the same structure as the X-stage 12a, with the only difference that the Y-stage 12b moves in the Y-direction, hence its explanation is omitted.

The driver 33 is provided with a case 33a that is a housing, a drive roller 33b and a press roller 33c both for moving the rod 32, and a motor 33d (see FIG. 4) for rotating the drive roller 33b. The driver 33 generates vibration in operation. The driver 33 that becomes a vibrator is disposed on the wall surface on which the first laser interferometer 13a and the second laser interferometer 13b are disposed.

The case 33a is formed like a box so as to accommodate the drive roller 33b, the press roller 33c, and so on. The case 33a has a pair of through holes 33a1 and 33a2 facing each other, both of which the rod 32 passes through.

The drive roller 33b is positioned so that its axial center is perpendicular to the extension direction (X-direction) of the rod 32 and its outer peripheral surface is contact with the upper surface of the rod 32. The drive roller 33b is accommodated in the case 33a so as to rotate with its axial center as a rotary axis. The drive roller 33b is rotated by the motor 33d to drive the rod 32 in the X-direction by contact friction.

The press roller 33c is positioned in such a manner that its axial center is perpendicular to the extension direction (X-direction) of the rod 32 and its outer peripheral surface is contact with the lower surface of the rod 32. The press roller 33c is accommodated in the case 33a so as to rotate with its axial center as a rotary axis. The press roller 33c faces the drive roller 33b with the rod 32 therebetween. The press roller 33c is pushed upward by a press member (not shown), such as a spring, to be contact with the rod 32 at a specific pressure.

The motor 33d (see FIG. 4) rotates the drive roller 33b, as a driving source for moving the rod 32 in the X-direction. The motor 33d is fixed at a side wall of the case 33a so as not to interfere with the vibration damping mechanism 34.

The vibration damping mechanism 34 is provided with a first elastic tube 34a connected to the outer surface of the drawing chamber 2a and one end of case 33a of the driver 33, a second elastic tube 34b connected to the other end of the case 33a, a terminal closer 34c that closes the other end of the second elastic tube 34b, a plurality of spacers (gap holders) 34d that keep a gap between the drawing chamber 2a and the terminal closer 34c, and a supporter 34e for supporting the driver 33.

The first elastic tube 34a is disposed between the outer surface of the drawing chamber 2a and the outer surface of the case 33a in the same side as the drawing chamber 2a. The first elastic tube 34a communicates with the inner spaces of the drawing chamber 2a and the case 33a to keep the airtightness. The first elastic tube 34a contains, at its one end opening, a through hole 2a1 provided on a side wall of the drawing chamber 2a and contains, at its other end opening, the through hole 33a1 of the case 33a, securing the airtightness, for example, with sealing members (not shown) such as O-rings or by welding at both ends.

The first elastic tube 34a expands and contracts to absorb vibration caused by the driver 33. The first elastic tube 34a may be a bellows tube. The rod 32 is laid in the first elastic tube 34a to move in the extension direction (X-direction) of the first elastic tube 34a. The first elastic tube 34a is made of a material, such as a metallic material like stainless steel, which can maintain a vacuum state inside the tube.

The second elastic tube 34b is disposed between the outer surface of the case 33a in the opposite side to the drawing chamber 2a, and the outer surface of the terminal closer 34c in the same side as the drawing chamber 2a. The second elastic tube 34b communicates with the inner space of the case 33a to keep the airtightness. The second elastic tube 34b contains, at its one end opening, the through hole 33a2 of the case 33a and contains, at its other end opening, a through hole 34c1 of the terminal closer 34c. The airtightness is kept, for example, with sealing members (not shown) such as O-rings or by welding at both ends.

In the same manner as the first elastic tube 34a, the second elastic tube 34b expands and contracts to absorb vibration caused by the driver 33. Like the first elastic tube 34a, the second elastic tube 34b may be a bellows tube. The rod 32 is laid in the second elastic tube 34b to move in the extension direction (X-direction) of the second elastic tube 34b. Like the first elastic tube 34a, the second elastic tube 34b is made of a material, such as a metallic material like stainless steel, which can maintain a vacuum state inside the tube.

The first elastic tube 34a and the second elastic tube 34b are arranged to have the case 33a of the driver 33 supported by the supporter 34e interposed therebetween. Moreover, the first elastic tube 34a and the second elastic tube 34b have the same opening size (diameter) with the identical opening area. The case 33a of the driver 33 communicates with the inner spaces of the first elastic tube 34a and the second elastic tube 34b to maintain the airtightness.

The terminal closer 34c includes a plate 41 located at one end of the second elastic tube 34b in the opposite side to the drawing chamber 2a, and a hollow case 42 that offers a space for the rod 32 to move (a space for securing the movement of the rod 32).

The plate 41 is provided at the end of the second elastic tube 34b in the opposite side to the drawing chamber 2a, to close an opening of the end. The plate 41 has a through hole 34c1 through which the rod 32 passes. The plate 41 is made of a metallic material such as stainless steel. The plate 41 is formed in a rectangular shape, for example. It is, however, not limited to such a shape, but may be formed in any shape.

The hollow case 42 is a tubular case that offers a space for the rod 32 to move and communicates with the inner space of the case 33a of the driver 33 via the second elastic tube 34b to maintain the airtightness. The hollow case 42 is made of a material, such as a metallic material like stainless steel, which can maintain a vacuum state inside the case.

A plurality of the spacers 34d are provided between the outer surface of the drawing chamber 2a and the terminal closer 34c. Even if the atmospheric pressure is applied to the terminal closer 34c while the apparatus is in a vacuum state, the spacers 34d keep a gap between the outer surface of the drawing chamber 2a and the terminal closer 34c, without pressing the two elastic tubes 34a and 34b. The spacers 34d are made of a rod-like member, for example. For example, four spacers 34d (see FIG. 4) are provided at four corners of the terminal closer 34c, between the outer surfaces of the drawing chamber 2a and the terminal closer 34c. The spacers 34d are made of, for example, a metallic material like stainless steel. The spacers 34d are formed like a rod, however, may be formed like a plate. The shape of the spacers 34d is, however, not limited to such a shape. The number of the spacers 34d is also not limited to any particular number.

An vibration proof member 34f for absorbing vibration is connected to the supporter 34e. The supporter 34e supports the case 33a, with the vibration proof member 34f therebetween. The supporter 34e is attached to an outer surface (side wall) of the drawing chamber 2a. An elastic body, such as an vibration proof rubber or a resin, may be used as the vibration proof member 34f. The vibration proof member 34f is disposed to be in surface-to-surface contact with the lower surface of the case 33a of the driver 33. Not limited to the surface-to-surface contact, the vibration proof member 34f may be disposed to be in point-to-point contact with the lower surface of the case 33a of the driver 33. The vibration proof member 34f is formed like a plate. The shape of the vibration proof member 34f is, however, not limited to such a shape. Moreover, any particular number of vibration proof members 34f may be provided.

A vibration damping operation of the charged-particle beam drawing apparatus 1, having the configuration described above, in a vacuum state (decompressed state) will be explained next.

Firstly, the drawing chamber 2a and the optical column 2b are decompressed into a vacuum state at a specific degree of vacuum before drawing. In this occasion, the case 33a of the driver 33, the first elastic tube 34a and the second elastic tube 34b, and the hollow case 42 are also put into the vacuum state. In this vacuum state, when the mount 11 is moved by the XY-stage 12 for drawing or the like, either or both of the X- and Y-stages 12a and 12b are driven by the motor 33d of the driver 33.

During driving by the motor 33d, vibration caused by the motor drive is damped by the first elastic tube 34a and the second elastic tube 34b located on both sides of the case 33a of the driver 33. Therefore, it is restricted that the vibration caused by the driving of the motor 33d is transferred, via the drawing chamber 2a, to the laser interferometers 13 located at the outer surface of the drawing chamber 2a, thereby restricting the vibration of the laser interferometers 13. Accordingly, it is possible to restrict the deterioration in measurement accuracy of the laser interferometers, and hence restrict the deterioration in apparatus accuracy (accuracy degradation).

In this vibration damping operation, the forces of the first elastic tube 34a and the second elastic tube 34b to contract caused by the atmospheric pressure are cancelled with each other so as not to lose flexibility. In this occasion, the gap between the outer surface of the drawing chamber 2a and the outer surface of the terminal closer 34c in the same side as the drawing chamber 2a is kept by the spacers 34d, which gives a constant position to the end of the second elastic tube 34b in the same side as the terminal closer 34c. In this way, the first elastic tube 34a and the second elastic tube 34b are prevented from contraction caused by the atmospheric pressure, and flexibility of the first elastic tube 34a and the second elastic tube 34b is kept. Therefore, the deterioration of the damping characteristics due to lacking in flexibility is prevented.

If the second elastic tube 34b is not provided, the first elastic tube 34a contracts due to the atmospheric pressure to lose flexibility, and hence degrades the vibration characteristics. In order to avoid the degradation of the vibration characteristics, it is required to maintain the first elastic tube 34a in a flexible state. For this purpose, the driver 33 is interposed between the first elastic tube and the second elastic tube 34b having the same opening area to cancel the forces of the first elastic tube 34a and the second elastic tube 34b to contract due to the atmospheric pressure. With this arrangement, the decrease in flexibility of the first elastic tube 34a and the second elastic tube 34b is restricted, which makes it possible for the first elastic tube 34a and the second elastic tube 34b to damp the motor vibration (vibration caused by the motor 33d) transferred to the drawing chamber 2a, thereby securing the apparatus accuracy such as drawing accuracy.

It is required to correctly take balance of the force cancellation discussed above between the first elastic tube 34a and the second elastic tube 34b. Extremely unbalanced force cancellation causes that the either one of the first elastic tube 34a and the second elastic tube 34b contracts due to the atmospheric pressure and the other expands to lose flexibility, resulting in worse vibration characteristics. For the reason above, the first elastic tube 34a and the second elastic tube 34b are made of the same material to have the same opening area so as to generate the same force to contract due to the atmospheric pressure.

A slight unbalanced force cancellation is acceptable to maintain the flexibility to damp vibration. A certain degree of unbalanced force cancellation depending on the degree of motor vibration (strong or weak) is also acceptable to maintain the flexibility required for damping vibration. Accordingly, it is preferable to give the same level of forces to the first elastic tube 34a and the second elastic tube 34b to contract due to the atmospheric pressure. Nevertheless, the forces may not be completely the same as each other.

As described above, according to the first embodiment, by sandwiching the driver 33 between the first elastic tube 34a and the second elastic tube 34b, it is possible to cancel the forces of the first elastic tube 34a and the second elastic tube 34b to contract due to the atmospheric pressure, to maintain their flexibility. Therefore, it is possible to damp motor vibration transferred to the drawing chamber 2a, by means of the first elastic tube 34a and the second elastic tubes 34b. Accordingly, it is possible to restrict the deterioration in measurement accuracy of the laser interferometers, and hence restrict the deterioration in apparatus accuracy such as drawing accuracy.

Second Embodiment

A second embodiment will be explained with reference to FIG. 5. What will be explained in the second embodiment is a difference (installation of a pump) with the first embodiment, the same reference numerals being given to the elements identical with those explained in the first embodiment, the explanation thereof being omitted.

In FIG. 5, in the second embodiment, a pump unit 51 is disposed on the outer surface of the drawing chamber 2a. The pump unit 51 is provided with a case 33a identical with that in the first embodiment and a decompressor 51a installed in the case 33a, for decompressing the drawing chamber 2a. The decompressor 51a decompresses the drawing chamber 2a and the optical column 2b into a vacuum state at a specific degree of vacuum. As the decompressor 51a, a decompression pump such as a turbo-pump that can be a vibration source may be used.

Since the pump unit 51 becomes a vibrator that vibrates while the decompressor 51a is being driven, the pump unit 51 is installed in the vibration damping mechanism 34 which is provided on the outer surface of the drawing chamber 2a. The vibration damping mechanism 34 is installed in the same manner as in the first embodiment. However, the drawing chamber 2a has a through hole 2a2 at its side wall, which is enclosed in one end opening of the first elastic tube 34a of the vibration damping mechanism 34. The terminal closer 34c formed like a plate completely closes the opening of the second elastic tube 34b.

With the vibration damping mechanism 34 having the configuration described above, like the first embodiment, it is restricted that the vibration caused by the driving of the motor 33d is transferred, via the drawing chamber 2a, to the laser interferometers 13 located at the outer surface of the drawing chamber 2a. Accordingly, it is possible to restrict the deterioration in measurement accuracy of the laser interferometers, and hence restrict the deterioration in apparatus accuracy (accuracy degradation) such as drawing accuracy.

As described above, according to the second embodiment, the effects the same as the first embodiment can be obtained.

In detail, by sandwiching the pump unit 51 between the first elastic tube 34a and the second elastic tube 34b, it is possible to cancel the forces of the first elastic tube 34a and the second elastic tube 34b to contract due to the atmospheric pressure, to maintain their flexibility. Therefore, it is possible to damp motor vibration transferred to the drawing chamber 2a, by means of the first elastic tube 34a and the second elastic tube 34b. Accordingly, it is possible to restrict the deterioration in measurement accuracy of the laser interferometers, and hence restrict the deterioration in apparatus accuracy such as drawing accuracy.

Other Embodiments

In the first embodiment and the second embodiment described above, the vibration damping mechanism 34 is applied to the charged-particle beam drawing apparatus 1. However, the vibration damping mechanism 34 can be applied to other types of charged-particle beam drawing apparatus such as an electron microscope, exposure equipment, and inspection equipment.

Moreover, in the first embodiment and the second embodiment described above, the first elastic tube 34a and the second elastic tube 34b are formed to have the same opening area. However, not limited to this, the first elastic tube 34a and the second elastic tube 34b may be formed to have different opening areas depending on the force cancellation adjustments discussed above. Nevertheless, when the difference in opening area becomes large, the vibration damping effect in the embodiments is reduced, it is thus preferable to have an opening area ratio within 1:2.

Furthermore, in the first embodiment and the second embodiment described above, the case 33a of the driver 33 or the pump unit 51 is supported by the supporter 34e. However, not limited to this, for example, the spacers 34d located beneath the case 33a may be formed like a plate to support the case 33a, with the vibration proof member 34f interposed therebetween. In this case, the spacers 34d function as a supporter.

Still, furthermore, in the first embodiment and the second embodiment described above, the supporter 34e is provided on the outer surface of the drawing chamber 2a. However, not limited to this, for example, the supporter 34e may be attached to another member like a mount for supporting the drawing chamber 2a.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A charged-particle beam drawing apparatus comprising:
   an airtight vacuum chamber;
   a first elastic tube that is airtight and provided on an outer surface of the vacuum chamber and communicates with an inner space of the vacuum chamber;
   an airtight vibrator that is provided at an end of the first elastic tube at an opposite side to the vacuum chamber and communicates with an inner space of the first elastic tube;
   a second elastic tube that is airtight and provided at an end of the vibrator at an opposite side to the first elastic tube and communicates with an inner space of the vibrator;
   a terminal closer that is provided at an end of the second elastic tube at an opposite side to the vibrator and closes the end of the second elastic tube; and
   a gap holder that is provided between the outer surface of the vacuum chamber and the terminal closer, the gap holder being configured to keep a gap between the outer surface of the vacuum chamber and the terminal closer.

2. The apparatus of claim 1 further comprising:
   a supporter that supports the vibrator; and
   a vibration damper that is provided between the vibrator and the supporter, and the vibration damper being configured to absorb vibration.

3. The apparatus of claim 2, wherein the supporter is provided on the outer surface of the vacuum chamber.

4. The apparatus of claim 2, wherein the gap holder is the supporter.

5. The apparatus of claim 1, wherein the gap holder is connected to the outer surface of the vacuum chamber and the terminal closer, the gap holder comprising a plurality of parts arranged apart from one another.

6. The apparatus of claim 1, wherein when one of the first elastic tube and the second elastic tube moves in a direction of contraction, another elastic tube moves in a direction of expansion.

7. The apparatus of claim 1, wherein one of the first elastic tube and the second elastic tube contracts and another expands to absorb vibration of the vibrator.

8. The apparatus of claim 1 further comprising a shaft that is movable in an axial direction and is disposed throughout inside the vacuum chamber, the first elastic tube, the vibrator, and the second elastic tube.

9. The apparatus of claim 8, wherein the vibrator comprises a motor to move the shaft in the axial direction.

10. The apparatus of claim 8, wherein the terminal closer comprises a plate connected to the second elastic tube, and a chamber into which a shaft is inserted.

11. A vibration damping mechanism comprising:
a first elastic tube that is airtight and provided on an outer surface of an airtight vacuum chamber and communicates with an inner space of the vacuum chamber;
a second elastic tube that is airtight and provided at an end of an airtight vibrator at an opposite side to the first elastic tube, and communicates with an inner space of the vibrator, the vibrator being provided at an end of the first elastic tube in the opposite side to the vacuum chamber, and communicating with an inner space of the vacuum chamber;
a terminal closer that is provided at an end of the second elastic tube at an opposite side to the vibrator, and closes the end of the second elastic tube; and
a gap holder that is provided between the outer surface of the vacuum chamber and the terminal closer, the gap holder being configured to keep a gap between the outer surface of the vacuum chamber and the terminal closer.

12. The mechanism of claim 11 further comprising:
a supporter that supports the vibrator; and
a vibration damper that is provided between the vibrator and the supporter, to absorb vibration.

13. The mechanism of claim 12, wherein the supporter is provided on the outer surface of the vacuum chamber.

14. The mechanism of claim 12, wherein the gap holder is the supporter.

15. The mechanism of claim 11, wherein the gap holder is connected to the outer surface of the vacuum chamber and the terminal closer, the gap holder comprising a plurality of parts arranged apart from one another.

16. The mechanism of claim 11, wherein when one of the first elastic tube and the second elastic tube moves in a direction of contraction, another moves in a direction of expansion.

17. The mechanism of claim 11, wherein one of the first elastic tube and the second elastic tube contracts and another expands to absorb vibration of the vibrator.

18. The mechanism of claim 11 further comprising a shaft that is movable in an axial direction and is disposed throughout inside the vacuum chamber, the first elastic tube, the vibrator, and the second elastic tube.

19. The mechanism of claim 18, wherein the first elastic tube and the second elastic tube restrict vibration caused by driving of a motor to move the shaft in the axial direction.

20. The mechanism of claim 18, wherein the terminal closer comprises a plate connected to the second elastic tube, and a chamber into which the shaft is inserted.

* * * * *